United States Patent [19]

Suga et al.

[11] Patent Number: 5,128,417

[45] Date of Patent: Jul. 7, 1992

[54] 3-METHYLBUTENE-1 POLYMER, COMPOSITION CONTAINING SAID POLYMER, AND MOLDED ARTICLES OF SAID COMPOSITION

[75] Inventors: Yoshinori Suga, Tokyo; Eiji Tanaka; Nobuo Enokido, both of Kanagawa; Yasuo Maruyama, Tokyo, all of Japan

[73] Assignee: Mitsubishi Kasei Corporation, Tokyo, Japan

[21] Appl. No.: 539,296

[22] Filed: Jun. 18, 1990

Related U.S. Application Data

[63] Continuation of Ser. No. 143,226, Jan. 4, 1988, abandoned, which is a continutation of Ser. No. 763,390, filed as PCT/JP84/00569, Nov. 29, 1984, abandoned.

[30] Foreign Application Priority Data

| Nov. 30, 1983 | [JP] | Japan | 58-225783 |
| Mar. 30, 1984 | [JP] | Japan | 59-62986 |
| Apr. 3, 1984 | [JP] | Japan | 59-66376 |

[51] Int. Cl.$^5$ ............... C08F 255/10; C08L 23/18
[52] U.S. Cl. ..................... 525/301; 524/504; 524/531; 524/536; 525/285; 525/320; 525/74; 525/78
[58] Field of Search ............. 525/285, 301, 320, 74, 525/78; 524/531, 536, 504

[56] References Cited

U.S. PATENT DOCUMENTS

| 3,876,729 | 4/1975 | Mueller | 525/276 |
| 3,886,227 | 5/1975 | Van Brederode et al. | 525/74 |
| 3,953,541 | 4/1976 | Fuji | 525/301 |
| 3,953,655 | 4/1976 | Steinkamp et al. | 525/285 |
| 4,087,480 | 5/1978 | Takahashi et al. | 525/65 |
| 4,382,128 | 5/1983 | Li | 525/285 |
| 4,501,827 | 2/1985 | Nagano et al. | 525/74 |
| 4,506,056 | 3/1985 | Gaylord | 524/531 |
| 4,562,229 | 12/1985 | Walker et al. | 525/74 |

FOREIGN PATENT DOCUMENTS 0082704  6/1983  European Pat. Off. ............ 525/301

OTHER PUBLICATIONS

Translation of Japan 44-7751, Apr. 11, 1969.
Abstract of Japan ref 69-7751 published 1968.
Journal of Polymer Sciences, Part A-2, vol. 8, 1971-1986 (1970).
Journal of Polymer Science: Part A vol. 1, pp. 751-762 (1963).
Journal of Applied Polymer Science, vol. 9, pp. 3023-3031 (1965).
"Ten Special Synthetic Rubbers" edited by Japan Rubber Association, with partial translation.

Primary Examiner—James J. Seidleck
Assistant Examiner—Vasu S. Jagannathan
Attorney, Agent, or Firm—Sughrue, Mion, Zinn, Macpeak & Seas

[57] ABSTRACT

A modified 3-methylbutene-1 polymer as prepared by grafting a monomer containing an unsaturated group onto a 3-methylbutene-1 homo- or copolymer, a 3-methylbutene-1 polymer composition comprising a 3-methylbutene-1 polymer and a fibrous material, and a molded article comprising a mold of a 3-methylbutene-1 polymer and a thin metallic layer provided on the mold.

8 Claims, No Drawings

3-METHYLBUTENE-1 POLYMER, COMPOSITION CONTAINING SAID POLYMER, AND MOLDED ARTICLES OF SAID COMPOSITION

This is a continuation of application Ser. No. 07/143,226 filed Jan. 4, 1988, which is a continuation of 06/763,390 filed Jul. 30, 1985, now both abandoned.

TECHNICAL FIELD

The present invention relates to a graft-modified 3-methylbutene-1 polymer, wherein at least a part of the polymer is graft-reacted with a monomer containing an unsaturated group, a composition containing said modified 3-methylbutene-1 polymer which is excellent in mechanical characteristics, heat stability, and dimensional stability, and a molded article of said composition.

More particularly, the present invention relates to a graft-modified 3-methylbutene-1 polymer exhibiting excellent adhesion to substrates such as metal, resins and glass, a composition containing said 3-methylbutene-1 polymer which is excellent in stiffness, flexural strength, tensile strength, Izod impact strength, heat distortion temperature, adhesion, etc., and has a small coefficient of thermal expansion, and a molded article of said composition.

BACKGROUND ART

A 3-methylbutene-1 polymer (sometimes called a 3-methyl-1-butene polymer) is among polyolefins having the highest melting point, stiffness and strength and, in addition to excellent electrical insulation properties, nonhygroscopicity and chemical resistance which are characteristics of polyolefin resins, exhibits high heat resistance. Thus, the 3-methylbutene-1 polymer is expected to find many uses.

However, much higher stiffness, strength and heat distortion temperature are needed for some of electrical appliances, building materials, car parts, mechanical parts, and so forth. In these applications, the 3-methylbutene-1 polymer is not sufficiently satisfactory.

As a result of extensive investigations to develop a 3-methylbutene-1 polymer composition which can be used in the above described fields requiring higher stiffness, strength and heat distortion temperature, it has been found that the object can be attained by adding a specific amount of a fibrous material to a specific 3-methylbutene-1 polymer.

DISCLOSURE OF INVENTION

The gists of the present invention reside in:

a graft-modified 3-methylbutene-1 polymer having a melt viscosity (as determined at 330° C. and a shear rate of 0.1/sec) of at least $1 \times 10^3$ poises, wherein a monomer containing an unsaturated group is graft reacted in an amount of 0.001 to 5 wt% onto a homopolymer of 3-methylbutene-1 or a copolymer of 3-methylbutene-1 and other α-olefin and/or polyene;

a 3-methylbutene-1 polymer composition comprising 0 to 100 parts by weight of an unmodified 3-methylbutene-1 homopolymer or a copolymer of 3-methylbutene-1 and other α-olefin and/or polyene, 0.05 to 100 parts by weight of a graft-modified 3-methylbutene-1 polymer having a melt viscosity (as determined at a temperature of 330° C. and a shear rate of 0.1/sec) of at least $1 \times 10^3$ poises, wherein a monomer containing an unsaturated group is graft-reacted in an amount of 0.005 to 5 wt % onto a homopolymer of 3-methylbutene-1 or a copolymer of 3-methylbutene-1 and other α-olefin and/or polyene, and 3 to 60 wt % (based on the total weight of the composition) of a fibrous material;

a 3-methylbutene-1 polymer composition comprising 100 parts by weight of an unmodified 3-methylbutene-1 homopolymer or a copolymer of 3-methylbutene-1 and other α-olefin and/or polyene, 0.05 to 30 parts by weight of an olefin polymer other than a 3-methylbutene-1 polymer, on which a monomer containing an unsaturated group is graft-reacted, and 3 to 60 wt % (based on the total weight of the composition) of a fibrous material; and a molded article comprising a mold with a thin metallic film provided thereon, said mold being made of a 3-methylbutene-1 homopolymer or a copolymer of 3-methylbutene-1 and other α-olefin and/or polyene.

BEST MODE FOR CARRYING OUT THE INVENTION

The present invention will hereinafter be explained in detail.

The 3-methylbutene-1 polymer as used in the present invention includes a homopolymer of 3-methylbutene-1, and copolymers of 3-methylbutene-1 and other α-olefins or polyenes copolymerizable with 3-methylbutene-1. α-Olefins which can be used include ethylene, propylene, 1-butene, 1-pentene, 4-methylpentene-1, 1-hexene, 1-octene, 1-decene or vinylcyclohexane, and styrene. Polyenes which can be used include butadiene, hexadiene, methylhexadiene, ethylidene, and norbornene. Of these α-olefins and polyenes, α-olefins are preferably used. The number of carbon atoms in these olefins is 2 to 30 and preferably 2 to 20.

In cases, however, that a 3-methylbutene-1 homopolymer alone is used as the 3-methylbutene-1 polymer, a mold obtained by injection molding of a 3-methylbutene-1 polymer composition with a fibrous material compounded thereto is sometimes very brittle depending on the molding temperature. Thus, it is desirable that as the 3-methylbutene-1 polymer a copolymer of 3-methylbutene-1 and other olefin (hereinafter the term "olefin" or "olefins" is used to include both the α-olefin and polyene), or a mixture of a 3-methylbutene-1 homopolymer and a 3-methylbutene-1 /other olefin copolymer, or a mixture of a 3-methylbutene-1 homopolymer or 3-methylbutene-1/other olefin copolymer and another olefin polymer be used.

In the 3-methylbutene-1/other olefin copolymer, the olefin content is from 0.05 to 30 wt % and preferably from 0.05 to 20 wt %. If the olefin content is in excess of 30 wt %, the features of high melting point, high stiffness, and so forth, which are characteristics of the 3-methylbutene-1 polymer, are undesirably lost.

The copolymerization method may be random copolymerization or block copolymerization.

The amount of the other olefin polymer to be mixed with the 3-methylbutene-1 homopolymer or 3-methylbutene-1/other olefin copolymer is 0.05 to 30 wt % per 100 parts by weight of the 3-methylbutene-1 homo- or copolymer. In connection with the molecular weight of the 3-methylbutene-1 polymer, the melt viscosity as determined at 330° C. is in the range of $5 \times 10^3$ to $1 \times 10^7$ poises, preferably $5 \times 10^4$ to $1 \times 10^7$ poises If a polymer having a melt viscosity lower than the above-defined lower limit is used, the impact strength of the ultimate 3-methylbutene-1 polymer composition is undesirably decreased to a large extent.

Next, the graft-modified 3-methylbutene-1 polymer, wherein at least a part of the polymer is graft-reacted with a monomer containing an unsaturated group capable of undergoing a graft reaction, is described below.

The 3-methylbutene-1 polymer originally lacks adhesion properties to other substrates or compatibility with other resins because it is a nonpolar hydrocarbon polymer.

The graft modification of 3-methylbutene-1 in the present invention is intended to provide the above properties to the 3-methylbutene-1 polymer originally not having such properties.

The graft modified 3-methylbutene-1 polymer is prepared by grafting a monomer containing an unsaturated group capable of undergoing a graft reaction onto the above-described 3-methylbutene-1 polymer. It is particularly preferred to graft $\alpha\beta$-unsaturated carboxylic acids or their anhydrides. Typical examples of the $\alpha,\beta$-unsaturated carboxylic acid and its anhydride are acrylic acid, methacrylic acid, methyl acrylate, methyl methacrylate, and alicyclic carboxylic acids containing cis-type double bond in the molecule or their anhydrides, such as maleic acid, maleic anhydride, and citraconic acid.

The graft reaction method is not critical. For example, the slurry graft reaction using a radical initiator catalyst in a suitable medium or the gas phase reaction can be employed.

The solution graft reaction and the melt graft reaction are not preferred in that a high temperature is needed and a reduction in the molecular weight of the 3-methylbutene-1 polymer is large compared with the grafting efficiency. In the case of the slurry graft reaction or gas phase graft reaction, a powdered 3-methylbutene-1 polymer is used as the starting material and this powdery form can be maintained even after the graft reaction. Thus, the graft polymer obtained can be suitably used as a starting material for a powder coating without application of any additional treatment.

In the slurry graft method, solvents which can be used include aliphatic hydrocarbons such as hexane, heptane, and octane, aromatic hydrocarbons such as benzene, toluene, and xylene, and chlorinated aromatic hydrocarbons such as chlorobenzene and dichlorobenzene. The graft reaction temperature is 50 to 250° C. and preferably 100° to 200° C. The reaction time is usually 10 minutes to 24 hours and preferably 1 to 3 hours.

The amount of the unsaturated carboxylic acid used in the graft reaction is 0.05 to 50 parts by weight, preferably 10 to 30 parts by weight per 100 parts by weight of the 3-methylbutene-1 polymer. The amount of the peroxide used is 0.05 to 50 parts by weight, preferably 2 to 20 parts by weight per 100 parts by weight of the 3-methylbutene-1 polymer.

Various peroxides can be used depending on the graft reaction temperature and so forth. Peroxides which can be used include dicumyl peroxide, benzoyl peroxide, 2,5-dimethyl-2,5-di(tert-butylperoxy)hexane, and 2,5-dimethyl-2,5-di(tert-butylperoxy)hexyne-3.

The grafted amount of the graft reactive monomer is not critical, but preferably 50 ppm to 50,000 ppm.

The melt viscosity of the graft-modified 3-methylbutene-1 of the present invention should be at least $1 \times 10^3$ poises as determined using a conical-disk-shaped rotary rheometer at 330° C. and a shear rate of 0.1 (1/sec), i.e., an angular velocity of 0.1 radian/sec. If the melt viscosity is less than $1 \times 10^3$ poises, the graft-modified 3-methylbutene-1 polymer or composition containing the polymer is poor in elongation and impact resistance. Taking into consideration moldability, the upper limit of the melt viscosity is $1 \times 10^9$ poises and preferably $1 \times 10^8$ poises.

The 3-methylbutene-1 polymer composition of the present invention will hereinafter be explained.

In the case that the modified polyolefin is a modified 3-methylbutene-1 polymer, depending on the amount of the $\alpha\beta$-unsaturated carboxylic acid or its derivative being grafted onto the 3-methylbutene-1polymer, 0.05 to 100 parts by weight of the modified 3-methylbutene-1 polymer is compounded to 0 to 100 parts by weight of the unmodified 3-methylbutene-1 polymer. In the case that the modified polyolefin is polyolefin other than the 3-methylbutene-1 polymer, the compounding amount of the modified polyolefin is 0.05 to 30 parts by weight per 100 parts by weight of the 3-methylbutene-1 polymer.

The modified polyolefin other than the 3-methylbutene-1 polymer includes an ethylene polymer, copolymers of ethylene and other $\alpha$-olefins, a propylene polymer, an ethylene/propylene rubber, and a 4-methylpentene-1 polymer, all being grafted with a monomer capable of undergoing a graft reaction. Particularly preferred are modified polyolefins with $\alpha,\beta$-unsaturated carboxylic acid or its anhydride grafted thereon.

Typical examples of such $\alpha,\beta$-unsaturated carboxylic acids and their derivatives are acrylic acid, methacrylic acid, methyl acrylate, methyl methacrylate, and alicyclic carboxylic acids containing a cis-type double bond in the molecule or their anhydrides, such as maleic acid, maleic anhydride, and citraconic acid.

The grafted amount of the graft reactive monomer is not critical but preferably 50 ppm to 50,000 ppm.

The modified polyolefin is preferably a modified 3-methylbutene-1 polymer because it greatly increases stiffness, heat distortion temperature, and so forth. Particularly in a case that it is desired to increase impact resistance, a modified ethylene/$\alpha$-olefin copolymer, particularly a modified ethylene/propylene rubber can be compounded thereto.

The production method of the unmodified 3-methylbutene-1 polymer is not specifically limited, but the desired high molecular weight 3-methylbutene-1 polymer can be easily produced by the following method.

3-Methylbutene-1 is homopolymerized or copolymerized with the above $\alpha$-olefin at a temperature of 0° to 150° C. in an aliphatic, alicyclic or aromatic hydrocarbon (e.g., hexane, heptane, cyclohexane, and benzene), in a liquid olefin, or without the use of any solvent in the presence of a catalyst system comprising a solid titanium trichloride catalyst complex having the atom ratio of aluminum to titanium being 0.15:1) or less and containing a complexing agent, and aluminum-diisobutyl monochloride, and, if necessary, an electron-donating compound (e.g., ether, ester, amine, and amide) as a third component.

Such solid titanium trichloride catalyst complexes are described in Japanese Patent Publication Nos. 8451/80, 8452/80, 8003/80, 27871/79, 39165/80, and Published Unexamined Japanese Patent Application No. 34478/72.

The 3-methylbutene-1 polymer inevitably needs a high molding temperature because of its high melting point. Thus, a reduction in molecular weight due to degradation of the polymer during its molding is unavoidable. In order to minimize such degradation during the molding so that the polymer, after molding or after the fibrous material is compounded, can have such a molecular weight as to maintain a sufficiently high impact strength, it is preferred to choose a suitable stabilizer.

As such stabilizers, a combination of Irganox 1010 (trade name, produced by Ciba-Geigy (Japan) limited) and Irgafos P-EPQ (trade name, produced by Ciba-Geigy (Japan) Limited) and so forth can be used.

The 3-methylbutene-1 polymer powder thus produced has the features that the particles are in a spherical or oval form or similar form and do not substantially contain those having sides and edges, and string or whisker-shaped particles, they are uniform in the shape, and their size distribution is narrow. Thus, the graft-modified 3-methylbutene-1 polymer powder prepared from the above polymer powder is suitable as a starting material for a powder coating.

Fibrous materials which can be compounded to the composition of the present invention include glass fibers, carbon fibers, asbestos, potassium titanate fibers, rock wool fibers, boron fibers, silicon carbide, and Kevlar fibers (trade name). Of these fibers, glass fibers are preferred from viewpoints of strength, cost, and so forth. As glass fibers, those subjected to surface treatment are preferred from a viewpoint of mechanical strength or heat distortion temperature. Surface treating agents which can be used for this purpose include aminosilane compounds such as γ-aminopropyltrimethoxysilane, γ-aminopropyltriethoxysilane, and N-β-aminoethyl-γ-aminopropyltrimethoxysilane, and epoxysilanes such as γ-glycidoxypropyltrimethoxysilane and β-(3,4-epoxycyclohexyl)ethyltrimethoxysilane.

The compounding amount of the fibrous material varies with the kind of the fibrous material. It is usually 3 to 60 wt % and preferably 5 to 50 wt % based on the total weight of the composition. If the fibrous material content is less than 3 wt %, sufficiently high stiffness and heat distortion temperature, for example, cannot be obtained On the other hand, if it is in excess of 60 wt %, kneading workability is decreased.

The 3-methylbutene-1 polymer composition of the present invention is prepared by mixing the modified and unmodified 3-methylbutene-1 polymer, fibrous material, and if necessary, other modified polyolefin. These components can be mixed by either of the following two methods. One is to mix them at the same time, and the other is to mix some components in advance and then add the other component or components thereto. This mixing method is not critical. Usually an extruder and a Banbury mixer are employed.

There are no special limitations to the type of the extruder and the shape of the screw. For example, a monoaxial extruder and a biaxial extruder are used. In connection with the shape of the screw, a full-flighted screw and a dulmage screw, for example, are used.

The molded article comprising a mold of the 3-methylbutene-1 polymer and a thin metallic film provided thereon will hereinafter be explained.

As the 3-methylbutene-1 polymer as used herein, the above-described unmodified 3-methylbutene-1 homo- and copolymers, the modified 3-methylbutene-1 homo- and copolymers, and their mixtures and, furthermore, mixtures of the above polymers and other polyolefins or modified polyolefins can be used. In addition, mixtures of the above polymers and fibrous materials can be used.

In recent years the demand for plated plastics having excellent heat resistance, mechanical strength, and electrical properties has been increasing in many fields such as electric and electronic parts.

Conventional plastic plating has been directed mainly to an ABS resin and mainly from a viewpoint of metallic decoration. That is, no great importance has been placed on the heat resistance and electrical properties, for example, of the plated plastics.

On the other hand, plated plastics having excellent heat resistance, mechanical strength, and electrical properties can find various uses. For example, they can be used as connectors, print wiring substrates by the additive process, and magnetic recording materials by the dry plating process such as the vacuum deposition process. In these applications, however, the plated ABS resin is not sufficiently satisfactory in any one of heat resistance, mechanical strength and electrical properties. Thus, a plated plastics sufficiently satisfactory in all the heat resistance, mechanical strength and electrical properties has been desired.

The present inventors have made extensive investigations to obtain plated plastics having the desired properties as described above, particularly on polyolefin-based resins in view of their good electrical properties.

Commercially available polyolefins such as polyethylene, polypropylene, polybutene-1 and poly-4-methylpentene-1 have good electrical properties. However, all of the polyolefins are poor in heat resistance and also in the adhesion to a metallic layer.

That is, the present invention relates to a plated 3-methylbutene-1 polymer having excellent heat resistance, mechanical strength, and adhesion to a metallic layer. In the present invention, the above-described various 3-methylbutene-1 polymers can be used. The following can be preferably used.

(1) A homopolymer of 3-methylbutene-1, or a copolymer of 3-methylbutene-1 and α-olefin having 2 to 30 carbon atoms and/or polyene.

(2) A resin composition comprising a graft modified 3-methylbutene-1 polymer having a melt viscosity (as determined at 330° C. and a shear rate of 0.1/sec) of at least $1 \times 10^3$ poises, wherein at least a part of the polymer is graft-reacted with a monomer containing a graft reactive unsaturated group in an amount of 0.001 to 5 wt % based on the weight of a 3-methylbutene-1 homopolymer or 3-methylbutene-1/other α-olefin and/or polyene copolymer and, if necessary, an unmodified 3-methylbutene-1 polymer or copolymer, or other polyolefin.

(3) A resin composition comprising 100 parts by weight of a 3-methylbutene-1 homopolymer or 3-methylbutene-1/ other α-olefin and/or polyene copolymer as modified with a monomer containing a graft reactive unsaturated group, or an unmodified 3-methylbutene-1 polymer or copolymer, and at least 0.05 part by weight of an olefin polymer modified with a monomer containing an unsaturated group.

In addition, a composition containing the above resins (1) to (3) and 3 to 60 wt % (based on the total weight of the composition) of a fibrous material can be used.

Metals which can be used include copper, solder, silver, tin, nickel, gold and rhodium.

The metallic layer of the present invention can be applied by conventionally known techniques in both the wet and dry methods. Dry plating techniques include vapor deposition and sputtering. Plating can be carried out satisfactorily, for example, by the most commonly used wet plastic plating method comprising the following steps: degreasing→etching→sensitizing→activation→chemical plating→electroplating, although steps used herein are not limited thereto. In accordance with this method, a plated film having good adhesion properties can be obtained. If a hydrocarbon compound is applied at the degreasing or pretreatment step, a plated product exhibiting much better adhesion properties can be obtained. Hydrocarbon compounds which can be used for this purpose include aliphatic hydrocarbons such as hexane and heptane, alicyclic hydrocarbons such as cyclohexane, aromatic hydrocarbons such as benzene, toluene, and tetralin, and their halogenated derivatives. Of these compounds, aromatic hydrocarbons are preferred.

The thickness of the metallic film is preferably from 0.01 to 100 μ. The metal-plated product of the present invention can be used as, for example, a car part, an electric or electronic part, or as miscellaneous goods. In particular, making the best use of heat resistance of polyolefin, a print substrate which can be produced by injection molding is promising.

The present invention is described in greater detail with reference to the following examples, although it is not limited thereto.

The mechanical properties of the 3-methylbutene-1 polymer in the examples were measured according to ASTMD 638. The melt viscosity was measured as follows.

The 3-methylbutene-1 polymer was compression molded into a disc-shaped sheet having a diameter of 50 mm and a thickness of 1 mm at 330° C. for 6 minutes. This sheet was used as a test specimen. The melt viscosity was measured in a nitrogen stream under the conditions of temperature of 330° C. and angular rate of 0.1) radian/sec by the use of a conical-disk-shaped rotary rheometer. In this measurement, a cone-type plate having a diameter of 50 mm and a cone angle of 0.04 radian was used. Prior to the start of the measurement, the test piece was placed in the cone-type plate at 330° C. and pressed until the thickness of the test piece reached 50 μ. This compression needed a given time in proportion to the melt viscosity of the test piece. On the other hand, the melt viscosity of the 3-methylbutene-1 polymer decreased with a lapse of time as a result of heat degradation during the measurement. Thus, the melt viscosity as defined in the present invention is a melt viscosity of the test piece having a heat hysteresis of 0 hour as determined by the extrapolation method.

PREPARATION EXAMPLE 1

(A) Preparation of Uniform Solution of Titanium Trichloride

A 500 milliliter four-necked flask which had been purged with dry argon was charged with 150 ml of purified toluene and 90 mmol of titanium tetrachloride. In addition, 90 mmol of di-n-butyl ether was added. The titanium tetrachloride and di-n-butyl ether reacted with generation of some heat and became uniformly soluble in toluene, whereupon a uniform orange-yellow solution was obtained. A solution of 45 mmol of diethylaluminum monochloride dissolved in 20 ml of toluene was gradually added to the above solution while maintaining it at 25° C. with stirring, whereupon a dark orange-colored uniform solution of titanium trichloride was obtained.

(B) Formation of Titanium Trichloride Precipitate and Preparation of Catalyst The uniform solution of titanium trichloride as obtained at the step (A) above was heated to 95° C. In the course of this heating process, the formation of purple-colored titanium trichloride precipitate was observed. The mixture was stirred at 95° C. for 60 minutes. Then, the precipitate was separated by filtration and washed five times with 100 ml of n-heptane to obtain a finely granulated purple-colored titanium trichloride catalyst complex. Elemental analysis showed that the catalyst complex had a composition represented by the formula:

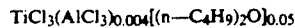

PREPARATION EXAMPLE 2

Preparation of 3-Methylbutene-1/Butene-1 Copolymer

3-Methylbutene-1 and butene-1 were copolymerized in a 25-liter stainless steel reactor by the use of the solid titanium trichloride catalyst complex as obtained in Preparation 1, as follows:

The reactor which had been thoroughly dried and purged with nitrogen was charged with 77.0 mmol of diisobutylaluminum monochloride and 8.0 kg of liquefied 3-methylbutene-1. The contents were heated to 70° C., and 9.05 g of the solid titanium trichloride catalyst complex as obtained in Preparation Example 1 was introduced under pressure into the reactor to start the polymerization. The polymerization was carried out while successively feeding butene-1. After 3.5 hours, 300 ml of isobutyl alcohol was introduced under pressure to stop the polymerization. The amount, of butene-1 supplied was 400 g. Subsequently the surplus unreacted monomer was removed from the reactor, and then 8.0 kg of n-hexane was introduced into the reactor. The resulting mixture was stirred at 50° C. for 30 minutes and then allowed to stand. The supernatant liquid was withdrawn, and the catalyst component in the polymer was removed by washing. This operation was repeated five times. Then, 0.2 parts of Irgafos PEPQ and 0.2 parts of Irganox 1010 were added, and the resulting mixture was dried to obtain 4.3 kg of a white powdery 3-methylbutene-1/butene-1 copolymer.

The melting point of the copolymer was 285° C., and its melt viscosity at 330° C. was $7 \times 10^5$ poises.

The obtained polymer particle was a white powder. These polymer particles were classified using sieves and it was found that the average particle diameter (50 wt % diameter) was 210 μm and the n value as determined by the Rosin-Rammler plotting was 3.5; that is, the polymer particles were uniform in particle size. Microscopic analysis showed that the particles were in a nearly spherical or its composite form, and did not generally have sides and edges and did not contain string- and whisker-shaped materials.

PREPARATION EXAMPLE 3

Preparation of 3-Methylbutene-1 Homopolymer

The procedure of Preparation Example 2 was repeated wherein butene-1 was not used, whereupon 4.1 kg of a 3-methylbutene-1 homopolymer having a melting point of 305° C. and a melt viscosity (as determined at 330° C.) of $6 \times 10^5$ poises was obtained.

PREPARATION EXAMPLE 4

Preparation of 3-Methylbutene-1 Copolymer

The procedure of Preparation Example 2 was repeated wherein a hexadecene/octadecene mixture (Dialene 168 produced by Mitsubishi Chemical Industries Limited) was copolymerized in place of butene-1 in a proportion of 7.3 wt %, whereupon 4.0 kg of a 3-methylbutene-1/hexadecene-1/octadecene-1 copolymer having a melting point of 297° C. and a melt viscosity (as determined at 330° C.) of $4 \times 10^5$ poises was obtained.

PREPARATION EXAMPLE 5

Preparation of 3-Methylbutene-1/Butene-1 Copolymer

The procedure of Preparation Example 2 was repeated wherein triethylaluminum was used as a co-catalyst in place of diisobutylaluminum chloride. The polymer thus obtained had a melting point of 287° C. and a melt viscosity (as determined at 330° C. after addition of 0.2 part of Irganox 1010 and 0.2 part of Irgafos PEPQ) of $3 \times 10^3$ poises.

PREPARATION EXAMPLE 6

Preparation of 3-Methylbutene-1/Butene-1 Copolymer

The procedure of Preparation Example 2 was repeated wherein a small amount of hydrogen was introduced at the initiation of polymerization. The 3-methylbutene-1/butene-1 copolymer thus obtained had a melting point of 287° C. and a melt viscosity (as determined at 330° C.) of $9 \times 10^4$ poises.

EXAMPLE 1

Five hundred grams of the powdered 3-methylbutene-1/butene-1 copolymer as obtained in Preparation Example 2 was suspended in 2.5 liter of chlorobenzene, and 50 g of 2,5-dimethyl-2,5-di(tert-butylperoxy)-hexyne3 (trade name: Perhexyne 2.5B, produced by Nippon Oil and Fats Co., Ltd.) and 150 g of maleic anhydride were added thereto. The mixture was heated to 180° C. in a pressure-resistant vessel equipped with a stirrer and then stirred at 180° C. for 3 hours to achieve the graft reaction. After the reaction, unreacted maleic anhydride and Perhexyne 2.5B were removed by washing with acetone. Then, 0.2 part of Irgafos PEPQ and 0.2 part of Irganox 1010 were added and then dried.

The amount of maleic anhydride grafted was 17,000 ppm. The viscosity at 330° C. was $1.5 \times 10^3$ poises.

EXAMPLE 2

Ten hundred grams of the powdered 3-methylbutene-1/butene-1 copolymer as obtained in Preparation Example 2 was suspended in 10 liter of xylene, and 100 g of dicumyl peroxide and 300 g of maleic anhydride were added thereto. The resulting mixture was heated to 130° C. and then stirred at 130° C. for 4 hours to achieve the graft reaction. After the reaction, unreacted maleic anhydride and dicumylperoxide were removed by washing with toluene and then with acetone. Then, 0.2 part of Irgafos PEPQ and 0.2 part of Irganox 1010 were added and dried.

The amount of maleic anhydride grafted was 3,600 ppm. The viscosity at 330° C. was $6 \times 10^4$ poises.

EXAMPLE 3

Maleic anhydride was grafted in the same manner as in Example 2 except that the polymer as obtained in Preparation Example 4 was used.

The amount of maleic anhydride grafted was 4,300 ppm. The viscosity at 330° C. was $4 \times 10^4$ poises.

EXAMPLE 4

One gram of maleic anhydride and 0.2 g of dicumyl peroxide per 100 g of the powdered polymer as obtained in Preparation Example 2 were dissolved in 50 cc of acetone and impregnated. The acetone was distilled away by gradually increasing the temperature using a rotary evaporator. The temperature was further increased, and the mixture was stirred at 150° C. for 2 hours. The powder thus obtained was washed repeatedly with acetone and then dried, whereupon a graft modified 3-methylbutene-1 powder containing 0.2 wt % of maleic anhydride, and having a melt viscosity of $1 \times 10^4$ posies and an average particle diameter (50 wt % diameter) of 210 μm was obtained.

COMPARATIVE EXAMPLE 1

Modification using maleic anhydride was conducted in the same manner as in Example 2 except that the powdered 3-methylbutene-1/butene-1 copolymer as obtained in Preparation Example 5 was used.

The amount of maleic anhydride grafted was 3,700 ppm. The melt viscosity at 330° C. was $5 \times 10^2$ poises.

EXAMPLE 5

The powdered polymer as obtained in Example 1 was fluidized in a stream of nitrogen preheated to 100° C. to thereby prepare a fluidized bed for coating. A steel plate which had been preheated to 400° C. was immersed in the fluidized bed for about 2 seconds to perform surface coating. A smooth coating having a thickness of about 800 μ was formed.

In order to determine the adhesion properties of the coating, crossed lines were cut in the coating at 2 mm intervals and a cellophane tape was sticked and peeled apart. No peeling was observed.

EXAMPLES 6 and 7

To 4.0 kg of the powdered 3-methylbutene-1/butene-1 copolymer as obtained in Preparation Example 2 was added 1.0 kg of the powdered maleic anhydride-modified 3-methylbutene-1/butene-1 copolymer as obtained in Example 2 and, further, glass fiber (03MA486A, produced by Asahi Fiber Glass Co., Ltd.) was added thereto in a proportion as shown in Table 1. The resulting mixture was melt kneaded and pelletized by the use of a 30 mm monoaxial extruder (dulmage type screw).

The pellets thus obtained were molded using a 1-ounce injection molding machine to produce a test piece. The mechanical strength and coefficient of thermal expansion of the test piece were measured. The results are shown in Table 1.

EXAMPLE 8

Pellets were produced in the same manner as in Example 7 except that 1.0 kg of the powdered maleic anhydride-modified 3-methylbutene-1/butene-1 copolymer as obtained in Example 2 was added to 4.0 kg of the powdered 3-methylbutene-1 homopolymer as obtained in Preparation Example 3.

The pellets thus produced were injection molded. The results are shown in Table 1.

EXAMPLE 9

Pellets were produced in the same manner as in Example 6 except that potassium titanate fibers (Tismo-D, produced by Otsuka Chemical Co., Ltd.) were used as the fibrous material.

The pellets thus obtained were injection molded. The results are shown in Table 1.

EXAMPLE 10

Pelletization and injection molding were performed in the same manner as in Example 8 except that an ethylene/propylene rubber (EPR) (EP07P, produced by Mitsubishi Petrochemical Co., Ltd.) modified with maleic anhydride (9,000 ppm) was used in place of the maleic anhydride-modified 3-methylbutene-1/butene-1 copolymer.

The results are shown in Table 1.

EXAMPLE 11

Pelletization and injection molding were performed in the same manner as in Example 6 except that in addition to the glass fibers, calcium carbonate was added.

The results are shown in Table 1.

COMPARATIVE EXAMPLE 2

Pelletization and injection molding were performed in the same manner as in Example 6 except that the 3-methylbutene-1/butene-1 copolymer as obtained in Preparation Example 5 was used in place of the 3-methylbutene-1/butene-1 copolymer, and the modified 3-methylbutene-1/butene-1 copolymer as obtained in Comparative Example 1 was used as the modified polyolefin.

The results are shown in Table 1.

COMPARATIVE EXAMPLE 3

Pelletization and injection molding were performed in the same manner as in Example 6 except that calcium carbonate was used in place of the fibrous material as the filler.

The results are shown in Table 1.

EXAMPLE 12

Pelletization and injection molding were performed in the same manner as in Example 7 except that 4.75 kg of the powdered 3-methylbutene-1/butene-1 copolymer as obtained in Preparation Example 6 was used in place of 4 kg of the 3-methylbutene-1/butene-1 copolymer as obtained in Preparation Example 2, and 0.25 kg of the powdered modified 3-methylbutene-1/butene-1 copolymer as obtained in Example 1 was used in place of 1.0 kg of the maleic anhydride-modified 3-methylbutene-1/butene-1 copolymer.

The results are shown in Table 1.

EXAMPLE 13

3-Methylbutene-1 was polymerized in a 1-liter induction agitation-type autoclave in the presence of the solid titanium trichloride catalyst complex as obtained in Preparation Example 1, as follows.

The autoclave which had been thoroughly vacuum dried and purged with nitrogen was charged with 1.467 g of the solid titanium trichloride catalyst complex as obtained in Preparation Example 1 and 21.6 mmol of diisobutylaluminum monochloride. Then, 283 g of liquefied 3-methylbutene-1 was introduced and polymerized at 20° C. for 4.5 hours. At the end of the time, 25 ml of isobutyl alcohol was added to stop the polymerization and, thereafter, surplus unreacted monomers were removed. Subsequently, 500 ml of n-hexane was introduced, and the resulting mixture was stirred at 50° C. for 30 minutes. Then, the supernatant liquid was withdrawn, and the catalyst component in the polymer was removed by washing. This procedure was repeated five times. The 3-methylbutene-1 polymer slurry thus formed was withdrawn and dried, thereby yielding 43 g of a white 3-methylbutene-1 polymer in a powder form.

The catalyst efficiency (3-methylbutene-1 polymer (g)/catalyst (g)) was 29. As additives, 0.2 part of Irganox 1010 and 0.2 part of Irgafos P-EPQ (both were the products of Ciba-Geigy (Japan) Limited) were added to the resulting 3-methylbutene-1 polymer. The resulting composition was press molded at 340° C. to produce a test piece. This test piece was plated with copper. This copper plating was performed as follows.

The test piece was treated in tetralin at 100° C. for 3 minutes and, thereafter, washed with ethanol at room temperature for 1 minute and then with hot water at 40° C. for 1 minute. Then the test piece was treated in a chromic acid mixture (400 g $CrO_2$ + 400 g $H_2SO_4$/l) at 70° C. for 10 minutes and, thereafter, washed with water and then neutralized with a 5% aqueous HCl solution. The test piece was further treated with B-200 Neutralizer and TMP Neutralizer (neutralizers produced by Okuno Seiyaku Kogyo Co., Ltd.) at room temperature each for 2 minutes. Between the two steps, a water-washing step was interposed. The test piece was treated with Catalyst C (produced by Okuno Seiyaku Kogyo Co., Ltd.) at room temperature for 3 minutes and then washed with water and, furthermore, treated with a 10% aqueous HCl solution at 40° C. for 3 minutes and then washed with water. The test piece was subjected to electroless copper plating for 8 minutes. The plating solution used was prepared by adding 100 ml of Kagakudo #100B and 100 ml of Kagakudo #100A (both were the products of Okuno Seiyaku Kogyo Co., Ltd.) to 400 ml of purified water. The thickness of the plated layer was 0.8 $\mu$.

The adhesion properties of the plated layer was rated as "A".

The adhesion properties were measured as follows.

The above-plated material was further subjected to electrolytic copper plating. When the thickness of the plated layer reached about 35 $\mu$, the material was taken out. The material was cut to produce an about 1 cm wide strip. This strip was mounted on a tensile tester and the 90° peel strength was measured.

The rating scale was as follows.

|   | Peel Strength (kg/cm) |
|---|---|
| A | more than 1.5 |
| B | 1.0 to 1.5 |
| C | 0.5 to 1.0 |
| D | less than 0.5 |

Using the above press strip, the melting point of the 3-methylbutene-1 polymer was measured with DSC Model 20 (produced by Seiko Instruments & Electronics Ltd.). The melting point (TM) was 307° C.

The dielectric dissipation factor as determined using an automatic capacitance bridge Model 4270A (produced by Yokogawa-Hewlett-Packard, Ltd.) was as follows.

tan δ = 0.0001 – 0.0002 in the range of 1 to 100 KHz at 20° C.

The plated material was maintained at 150° C. for 30 minutes. There was no change in appearance and the heat resistance was good.

EXAMPLE 14

The procedure of Example 13 was repeated wherein simultaneously with the initiation of polymerization, a small amount of ethylene was introduced every five minutes to introduce and copolymerize ethylene in a proportion of 5.0 wt % based on the total weight of the polymer. The amount of the copolymer was 66 g.

For this copolymer, TM = 300° C. and the adhesion properties of the plated layer were rated "A".

EXAMPLE 15

A mixture of 80 parts of the 3-methylbutene-1/butene-1 copolymer as obtained in Preparation Example 2 and 20 parts of the modified 3-methylbutene-1 /butene-1 copolymer as obtained in Example 2 was injection molded using a )-ounce injection molding machine to produce a 2 mm thick plate.

This plate was plated with copper in the same manner as in Example 13.

The adhesion properties of the plated layer was rated as "A".

EXAMPLE 16

The glass fiber-containing 3-methylbutene-1 copolymer composition as used in Example 7 was injection molded to produce a 2 mm thick plate. This plate was plated with copper in the same manner as in Example 13.

The adhesion properties of the plated layer was rated as "A".

EXAMPLE 17

The procedure of Example 13 was repeated wherein electroless nickel plating was applied in place of electroless copper plating. The plating solution used was TMP New Kagaku Nickel (produced by Okuno Seiyaku Kogyo Co., Ltd.).

The thickness of the plated layer was 0.7 μ, and the adhesion properties were rated as "A".

COMPARATIVE EXAMPLE 4

Electroless copper plating was applied in the same manner as in Example 13 except that polypropylene, Novatec-P, 4200E (produced by Mitsubishi Chemical Industries Limited) was used in place of the 3-methylbutene-1 polymer and press molded at 230° C.

The adhesion properties of the plated layer were rated as "D".

COMPARATIVE EXAMPLE 5

Electroless copper plating was applied in the same manner as in Comparative Example 4 except that ABS produced by Mitsubishi Rayon Co., Ltd. (Diapet ABS 300/M) was used in place of the polypropylene.

The adhesion properties of the plated layer were rated as "A".

The Vicat softening point (ISO R-360, JIS K6870) of Diapet ABS 300/M was 96° C.

When the plated article was maintained at 150° C. for 30 minutes in the same manner as in Example 13, the substrate began to melt and deform.

TABLE 1

| Run No. | 3-Methylbutene-1 Polymer Type* | Amount (wt %) | Modified Polyolefin Type* | Amount (wt %) | Fibrous Material Type | Amount (wt %) | Other Compound Type | Amount (wt %) |
| --- | --- | --- | --- | --- | --- | --- | --- | --- |
| Example 6 | (1) | 64 | (3) | 16 | Glass fiber | 20 | — | — |
| Example 7 | (1) | 56 | (3) | 14 | Glass fiber | 30 | — | — |
| Example 8 | (2) | 56 | (3) | 14 | Glass fiber | 30 | — | — |
| Example 12 | (6) | 66.5 | (7) | 3.5 | Glass fiber | 30 | — | — |
| Example 9 | (1) | 64 | (3) | 16 | Potassium titanate fiber | 20 | — | — |
| Example 10 | (2) | 50 | EPR | 10 | Glass fiber | 30 | — | — |
| Example 11 | (1) | 64 | (3) | 16 | Glass fiber | 20 | Calcium carbonate | 10 |
| Comparative Example 2 | (4) | 64 | (5) | 16 | Glass fiber | 20 | — | — |
| Comparative Example 3 | (1) | 64 | (3) | 16 | — | — | Calcium carbonate | 20 |

| Run No. | Flexural Modulus (kg/cm$^2$) | Flexural Strength (kg/cm$^2$) | Izod Impact Strength (kg · cm/cm$^2$) | Heat Distortion Temperature (°C.) | Coefficient of Thermal Expansion × 10$^5$ (cm/cm/°C.) |
| --- | --- | --- | --- | --- | --- |
| Example 6 | 84,000 | 1,300 | 7.1 | 249 | 2.7 |
| Example 7 | 110,000 | 1,700 | 10.0 | 260 | 2.5 |
| Example 8 | 120,000 | 1,900 | 6.0 | 265 | 2.5 |
| Example 12 | 100,000 | 1,600 | 12.0 | 265 | 2.3 |
| Example 9 | 72,000 | 1,100 | 6.5 | 230 | 2.7 |
| Example 10 | 90,000 | 1,200 | 12.0 | — | 3.1 |
| Example 11 | 90,000 | 1,350 | 6.2 | 251 | 2.5 |
| Comparative Example 2 | 81,000 | 610 | 0.3 | — | 2.7 |
| Comparative | 30,000 | 690 | 3.5 | 120 | 3.5 |

TABLE 1-continued

Example 3

*Note
(1) Polymer as obtained in Preparation Example 2
(2) Polymer as obtained in Preparation Example 3
(3) Polymer as obtained in Example 2
(4) Polymer as obtained in Preparation Example 5
(5) Polymer as obtained in Comparative Example 1
(6) Polymer as obtained in Preparation Example 6
(7) Polymer as obtained in Example 1

INDUSTRIAL APPLICABILITY

The modified 3-methylbutene-1 polymer of the present invention is good in adhesion to other substrates or compatibility with other resins because of its excellent activity. Thus, it is suitable for use in the preparation of various laminates and so forth. Furthermore, combined with its inherent excellent properties such as electrical inculation properties, nonabsorbent properties, chemical resistance, and heat resistance, the polymer can be used in various fields.

The composition of the present invention can be used as a structural material for which a high strength is needed, as a result of combination of the inherent properties of the 3-methylbutene-1 polymer and the reinforcing effect of the fibrous material. It can be preferably used in the preparation of, for example, a substrate for electric or electronic parts.

Furthermore, the molded article of the present invention, when used as a print wiring substrate, for example, exhibits excellent physical properties such as plating resistance and chemical resistance, because it has a thin metallic layer provided on the surface of the 3-methylbutene-1 polymer.

We claim:

1. A 3-methylbutene-1 polymer composition comprising (a) 0 to 100 parts by weight of an unmodified copolymer of 3-methylbutene-1 and other α-olefin which copolymer contains 0.005 to 30 wt % comonomer; (b) 0.05 to 100 parts by weight of a graft modified 3-methylbutene-1 polymer having a melt viscosity (as determined at a temperature of 330° C. and a shear rate of 0.1/sec) of at least $1 \times 10^3$ poises, said graft modified 3-methylbutene-1 polymer being prepared by grafting 0.005 to 5 wt % of a monomer selected from unsaturated carboxylic acids and anhydrides onto a copolymer of 3-methylbutene-1 and other α-olefin which copolymer contains 0.05 to 30 wt % comonomer in a slurry graft reaction process using a solvent selected from the group consisting of aliphatic hydrocarbons, unchlorinated aromatic hydrocarbons and chlorinated aromatic hydrocarbons; and (c) 3 to 60 wt % based on the total weight of the composition of a fibrous material.

2. The composition as claimed in claim 1, wherein the α-olefin is an α-olefin having 2 to 30 carbon atoms.

3. The composition as claimed in claim 1, wherein the graft monomer is at least one compound selected from the group consisting of maleic anhydride, acrylic acid, and alicyclic carboxylic acid anhydrides containing a cis-type double bond in the molecule thereof.

4. A 3-methylbutene-1 polymer composition as claimed in claim 1, wherein said copolymer of 3-methylbutene-1 and other α-olefin, which copolymer contains 0.05 to 30 wt % comonomer, is a crystalline polymer which has been obtained by polymerization by a stereospecific Ziegler catalyst.

5. A 3-methylbutene-1 polymer composition comprising (a) 0 to 100 parts by weight of an unmodified copolymer of 3-methylbutene-1 and other α-olefin which copolymer contains 0.005 to 30 wt % comonomer; (b) 0.05 to 100 parts by weight of a graft modified 3-methylbutene-1 polymer having a melt viscosity (as determined at a temperature of 330° C. and a shear rate of 0.1/sec) of at least $1 \times 10^3$ poises, as prepared by graft reacting a monomer selected from the unsaturated carboxylic acids and anhydrides in a proportion of 0.005 to 5 wt % onto a copolymer of 3-methylbutene-1 and other α-olefin which copolymer contains 0.05 to 30 wt % comonomer, and (c) 3 to 60 wt % based on the total weight of the composition of a fibrous material, wherein the graft reacting is a slurry graft reacting.

6. A 3-methylbutene-1 polymer composition comprising:
   (a) 0 to 100 parts by weight of an unmodified copolymer of 3-methylbutene-1 and other α-olefin which copolymer contains 0.005 to 30 wt % comonomer;
   (b) 0.05 to 100 parts by weight of a graft modified 3-methylbutene-1 polymer having a melt viscosity (as determined at a temperature of 330° C. and a shear rate of 0.1/sec.) of at least $1 \times 10^3$ poises, as prepared by graft reacting a monomer selected from the unsaturated carboxylic acids and anhydrides in a proportion of 0.005 to 5 wt % onto a powdery copolymer of 3-methylbutene-1 and other α-olefin which copolymer contains 0.05 to 30 wt % comonomer; and
   (c) 3 to 60 wt % based on the total weight of the composition of a fibrous material, wherein the graft reacting is a slurry graft reacting.

7. A 3-methylbutene-1 polymer composition comprising (a) 0 to 100 parts by weight of an unmodified copolymer of 3-methylbutene-1 and other α-olefin which copolymer contains 0.005 to 30 wt % comonomer; (b) 0.05 to 100 parts by weight of a graft modified 3-methylbutene-1 polymer having a melt viscosity (as determined at a temperature of 330° C. and a shear rate of 0.1/sec) of at least $1 \times 10^3$ poises, said graft modified 3-methylbutene-1 polymer being prepared by grafting 0.005 to 5 wt % of a monomer selected from unsaturated carboxylic acids and anhydrides onto a homopolymer of 3-methylbutene-1 in a slurry graft reaction process using a solvent selected from the group consisting of aliphatic hydrocarbons, unchlorinated aromatic hydrocarbons and chlorinated aromatic hydrocarbons; and (c) 3 to 60 wt % based on the total weight of the composition of a fibrous material.

8. A 3-methylbutene-1 polymer composition as claimed in claim 7, wherein said homopolymer of 3-methylbutene-1 prior to graft modification is a crystalline polymer which has been obtained by polymerization by a stereospecific Ziegler catalyst.

* * * * *